United States Patent
Chen et al.

(10) Patent No.: US 10,157,744 B2
(45) Date of Patent: Dec. 18, 2018

(54) METHOD FOR FORMING PATTERNS OF SEMICONDUCTOR DEVICE

(71) Applicants: UNITED MICROELECTRONICS CORP., Hsin-Chu (TW); Fujian Jinhua Integrated Circuit Co., Ltd., Quanzhou, Fujian (CN)

(72) Inventors: Kai-Ping Chen, Tainan (TW); Kuei-Hsuan Yu, New Taipei (TW); Chiu-Hsien Yeh, Tainan (TW); Li-Wei Feng, Kaohsiung (TW)

(73) Assignees: UNITED MICROELECTRONICS CORP., Hsin-Chu (TW); Fujian Jinhua Integrated Circuit Co., Ltd., Quanzhou, Fujian Province (CN)

(*) Notice: Subject to any disclaimer, the term of this patent is extended or adjusted under 35 U.S.C. 154(b) by 0 days.

(21) Appl. No.: 15/885,827

(22) Filed: Feb. 1, 2018

(65) Prior Publication Data

US 2018/0226251 A1    Aug. 9, 2018

(30) Foreign Application Priority Data

Feb. 6, 2017 (CN) .......................... 2017 1 0066194

(51) Int. Cl.

| | | |
|---|---|---|
| *H01L 21/311* | (2006.01) | |
| *H01L 21/033* | (2006.01) | |
| *H01L 21/02* | (2006.01) | |
| *H01L 21/027* | (2006.01) | |
| *H01L 27/108* | (2006.01) | |

(52) U.S. Cl.
CPC ...... *H01L 21/0338* (2013.01); *H01L 21/0273* (2013.01); *H01L 21/02118* (2013.01); *H01L 21/02356* (2013.01); *H01L 21/0332* (2013.01); *H01L 21/0337* (2013.01); *H01L 21/31144* (2013.01); *H01L 27/10814* (2013.01); *H01L 27/10823* (2013.01)

(58) Field of Classification Search
CPC ........... H01L 21/0338; H01L 21/02118; C07D 403/14; C07D 233/20; C07D 403/10
USPC ....................................................... 438/703
See application file for complete search history.

(56) References Cited

U.S. PATENT DOCUMENTS

| | | | | |
|---|---|---|---|---|
| 4,987,032 A | * | 1/1991 | Miyasaka | .......... B01D 67/0093 204/157.6 |
| 6,028,001 A | | 2/2000 | Shin | |
| 6,670,279 B1 | | 12/2003 | Pai | |
| 6,955,961 B1 | | 10/2005 | Chung | |
| 7,105,431 B2 | | 9/2006 | Yin | |
| 8,609,529 B2 | | 12/2013 | Lin | |
| 8,847,401 B2 | | 9/2014 | Chen | |
| 9,685,331 B1 | * | 6/2017 | Kawanishi | .......... H01L 21/0274 |

(Continued)

*Primary Examiner* — Caleb Henry
(74) *Attorney, Agent, or Firm* — Winston Hsu

(57) ABSTRACT

A method for forming patterns of semiconductor device is provided in the present invention, with steps of filling up first self-assembly material in first openings in a dielectric layer, phase-separating the first self-assembly material to form a first portion and a second portion surrounding the first portion, removing the first portion and performing a first etch process to form a first mask pattern in a mask layer, forming a second dielectric layer and repeating the above steps to form a second mask pattern in the mask layer, wherein the second mask pattern is aligned with the first mask pattern to form a common mask pattern.

11 Claims, 8 Drawing Sheets

(56) References Cited

U.S. PATENT DOCUMENTS

| | | | | |
|---|---|---|---|---|
| 2004/0081384 | A1* | 4/2004 | Datesman | G01N 21/431 385/12 |
| 2006/0046261 | A1* | 3/2006 | Porter | C07K 1/36 435/6.12 |
| 2006/0223305 | A1 | 10/2006 | Jones | |
| 2008/0171087 | A1* | 7/2008 | Chappa | A61L 29/06 424/486 |
| 2008/0192606 | A1* | 8/2008 | Kimura | B82Y 10/00 369/94 |
| 2010/0068783 | A1* | 3/2010 | Moloney | C03C 17/28 435/177 |
| 2011/0259849 | A1* | 10/2011 | Sakurai | B81C 99/009 216/22 |
| 2012/0058435 | A1* | 3/2012 | Seino | G03F 7/0755 430/324 |
| 2012/0164346 | A1* | 6/2012 | Yoneda | G03F 7/0035 427/553 |
| 2012/0231213 | A1* | 9/2012 | Yamamoto | B82Y 30/00 428/119 |
| 2012/0238109 | A1* | 9/2012 | Hattori | G03F 7/0046 438/780 |
| 2012/0241409 | A1* | 9/2012 | Kobayashi | H01L 51/003 216/37 |
| 2013/0323925 | A1* | 12/2013 | Asano | H01L 21/76801 438/666 |
| 2014/0049823 | A1* | 2/2014 | Grubbs | G02B 1/04 359/489.01 |
| 2014/0065839 | A1* | 3/2014 | Kawanishi | H01L 21/0271 438/761 |
| 2014/0069325 | A1* | 3/2014 | Kawanishi | C30B 19/00 117/54 |
| 2014/0072722 | A1* | 3/2014 | Kawanishi | C23C 16/00 427/532 |
| 2014/0087291 | A1* | 3/2014 | Taniguchi | G03F 1/70 430/5 |
| 2014/0087566 | A1* | 3/2014 | Kato | B81C 1/00031 438/761 |
| 2014/0094031 | A1* | 4/2014 | Maeda | H01L 21/027 438/669 |
| 2014/0199847 | A1* | 7/2014 | Kasahara | H01L 21/0337 438/703 |
| 2014/0242799 | A1* | 8/2014 | Takakuwa | H01L 21/76802 438/702 |
| 2014/0248439 | A1* | 9/2014 | Sato | G03F 7/0002 427/510 |
| 2014/0275555 | A1* | 9/2014 | Johnson | C07D 233/20 548/255 |
| 2014/0295669 | A1* | 10/2014 | Kawanishi | H01L 21/0271 438/702 |
| 2014/0374379 | A1* | 12/2014 | Kato | G03F 7/0035 216/40 |
| 2015/0151329 | A1* | 6/2015 | Kawanishi | G03F 7/0002 427/553 |
| 2015/0195916 | A1* | 7/2015 | Cheng | G03F 7/0002 216/47 |
| 2015/0242555 | A1* | 8/2015 | Wang | G06F 17/5068 438/694 |
| 2015/0339429 | A1* | 11/2015 | Zou | G06F 17/5081 716/52 |
| 2016/0061716 | A1* | 3/2016 | Motokawa | G01N 21/45 425/135 |
| 2016/0064216 | A1* | 3/2016 | Nakaoka | G03F 1/0046 438/700 |
| 2016/0068429 | A1* | 3/2016 | Terayama | C03C 15/00 216/47 |
| 2016/0068430 | A1* | 3/2016 | Suenaga | C03C 15/00 216/41 |
| 2016/0071740 | A1* | 3/2016 | Kodera | H01L 21/31144 438/700 |
| 2016/0077436 | A1* | 3/2016 | Sakurai | C03C 17/36 428/201 |
| 2016/0155743 | A1 | 6/2016 | Kim | |
| 2016/0244581 | A1* | 8/2016 | Brink | B05D 3/0453 |
| 2016/0289248 | A1* | 10/2016 | Johnson | C07F 7/0827 |
| 2017/0062271 | A1* | 3/2017 | Brink | H01L 21/76832 |
| 2017/0221701 | A1* | 8/2017 | Hunter | H01L 21/0271 |
| 2017/0344691 | A1* | 11/2017 | Brink | G03F 7/0002 |

* cited by examiner

METHOD FOR FORMING PATTERNS OF SEMICONDUCTOR DEVICE

BACKGROUND OF THE INVENTION

1. Field of the Invention

The invention relates generally to a method for forming patterns of semiconductor device, and more particularly, to a method of using a self-assembling process to form patterns of semiconductor device.

2. Description of the Prior Art

Recently, in view of the decrease in size of electronic devices and the increase in the degree of integration of semiconductor devices, there has been an increased demand for lithography technologies of forming fine nano-sized patterns. However, conventional photolithography technologies encounter difficulties in the fabrication of nano-sized fine patterns, in particular, nano-sized fine patterns of less than about 20 nm, due to the wavelength resolution limit. Accordingly, various methods based on new principles for fabricating nano-sized fine patterns have been studied in the semiconductor industry. One of these methods utilizes a self-assembled nano-structure.

The self-assembled material is a type of copolymer that may be self-assembled to form a nano-structure. The molecular structure of the self-assembled material typically includes chemically different polymer blocks connected to one another through covalent bonds. Such polymer blocks may be self-assembled to form various repeating nano-sized structures such as a sphere, a cylinder, and a lamella structure arranged in a regular period of about 5 to about 50 nm. The size and properties of the nanostructure maybe controlled via changing the monomer types, the ratio between the monomers, and a molecular weight of the polymer. In addition, the block copolymer may form nano-structures with a long range order. Since the nanostructure of the block copolymer can be used as an easily removable template, it is becoming attractive as a fine patterning technology for manufacturing various next-generation devices in the information technology (IT), biotechnology (BT), and environmental technology (ET) fields.

SUMMARY OF THE INVENTION

An unconventional photolithography method is accordingly provided in the present invention based on using the self-assembled material to form semiconductor patterns. The advantage and creativity of present invention is to manufacture semiconductor devices, such as a memory cell, with larger compactness in layout unit area and uniform diameter smaller than current photolithographic resolution limit without using expensive advanced photolithographic equipment or additional complicated processes.

The objective of present invention is to provide a novel method for forming patterns of semiconductor device, including the steps of filling up first openings in a dielectric layer with first self-assembled material, phase-separating the first self-assembly material to form a first portion and a second portion surrounding the first portion, removing the first portion and performing a first etch process to form a first mask pattern in a mask layer, forming a second dielectric layer and repeating the above steps to form a second mask pattern in the mask layer, wherein the second mask pattern is aligned with the first mask pattern to form a common mask pattern.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

Figure 10:
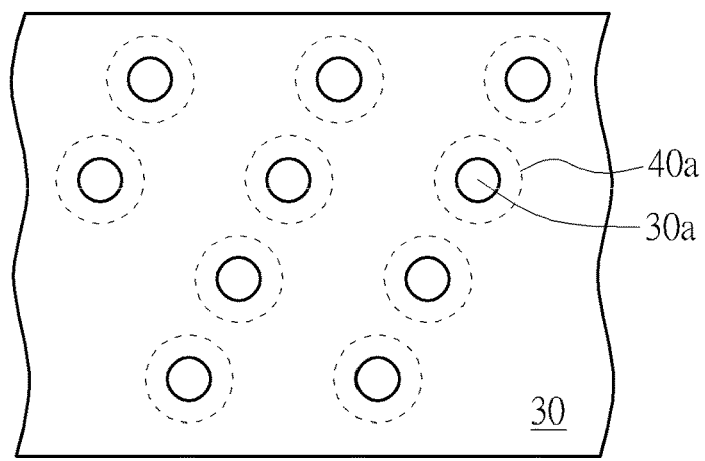
FIGS. 10-12 are schematic top views depicting an exemplary mask pattern in a mask layer at different stages of forming semiconductor patterns in accordance with the preferred embodiment of the present invention.
Figure 11:
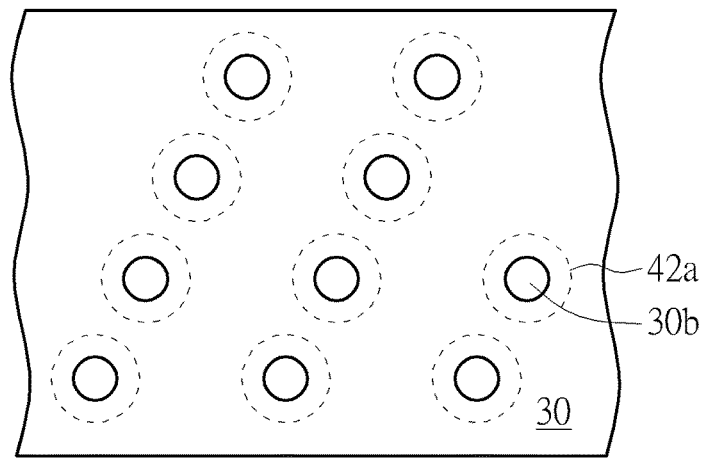
Figure 12:
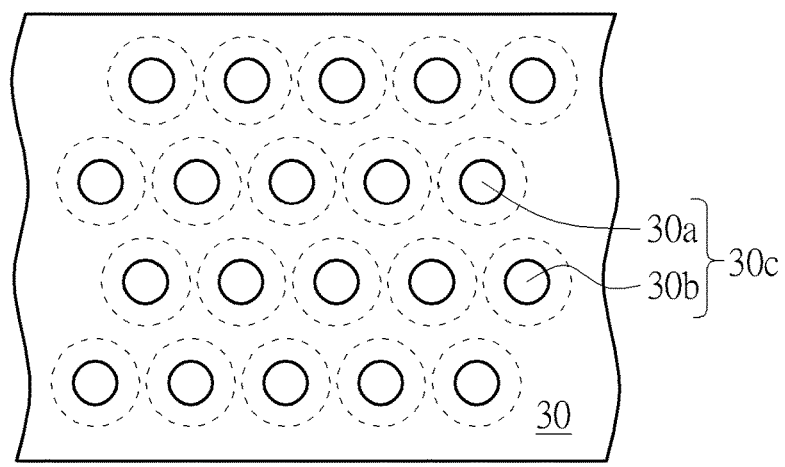

FIGS. 1-9 are cross-sectional views depicting an exemplary process flow of forming semiconductor patterns in accordance with the preferred embodiment of the present invention. FIGS. 10-12 are schematic top views depicting an exemplary mask pattern at different process stages in accordance with the preferred embodiment of the present invention. The explanation of the method of forming semiconductor patterns in the embodiment of present invention is provided hereinafter with reference to attached drawings.

Figure 1:
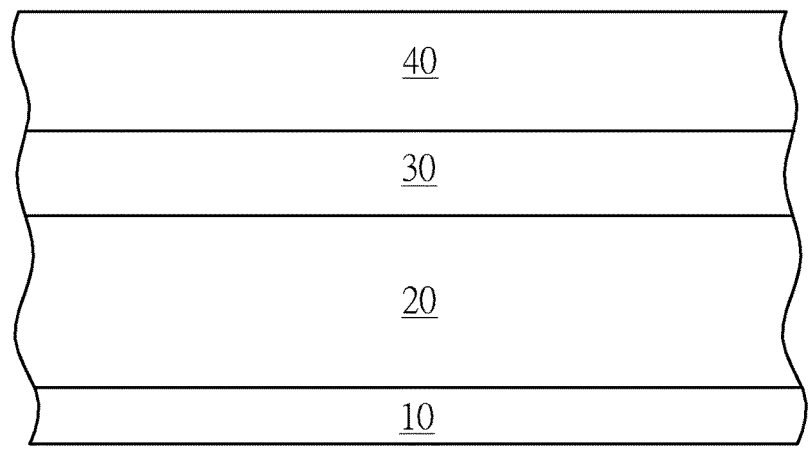
FIGS. 1-9 are cross-sectional views depicting an exemplary process flow of forming semiconductor patterns at different stages in accordance with the preferred embodiment of the present invention.

First, please refer to FIG. 1. The layer structures of a target layer 20, a mask layer 30 and a dielectric layer 40 are formed sequentially on a substrate 10, wherein the material of target layer 20 may be selected from the semiconductor materials, insulating materials or the combination thereof. For example, the target layer may be a semiconductor layer or an epitaxial layer on a semiconductor substrate, or a doped polysilicon layer, metal layer, metal silicide layer, metal nitride layer or the combination thereof, or a layer containing silicon oxide, silicon nitride, silicon oxynitride or low-k dielectric. In other embodiments, the target layer 20 may be formed by using monocrystalline silicon, amorphous silicon, doped silicon, silicon-germanium (SiGe) or carbon-based materials. The mask layer 30 may be formed by using materials having etch selectivity with respect to the target layer 20, such as a spin-on hard mask layer or an amorphous carbon film. The spin-on hard mask layer may include a carbon-based spin-on hard mask layer or silicon-based spin-on hard mask layer with a variable thickness depending on the thickness and material of the target layer 20. The dielectric layer 40 may be formed of silicon oxide or silicon nitride, etc.

Figure 2:
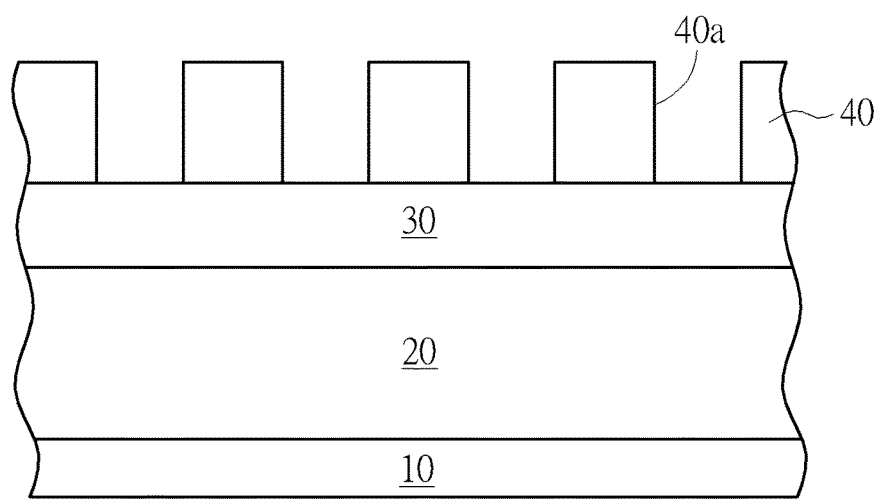

Please refer now to FIG. 2. A photolithographic process is performed to remove a part of the dielectric layer 40 and form multiple opening 40a therein. The photolithographic process may include first forming a photoresist with predetermined opening patterns on the dielectric layer 40. An etch process is then performed using the photoresist as an etch mask to remove the dielectric layer 40 exposed from the openings. The photoresist is removed after the etch process. In the embodiment of present invention, the size and spacing of the opening 40a may be close to the resolution limit (ex. smaller than 55 nm) of current ArF photolithographic equipment. To form smaller opening means a tall order to current photolithographic equipment. The problems such as inaccurate opening defined and opening pattern bridge usually occur in the process. The opening 40a may be aligned in regular rows and columns as shown in FIG. 10. Moderate space may be, but not limited, reserved between rows and columns of the openings 40a for other opening structures to be formed therein in later process. Further detail about the opening patterns of the mask will be provided in the following embodiment.

Figure 3:
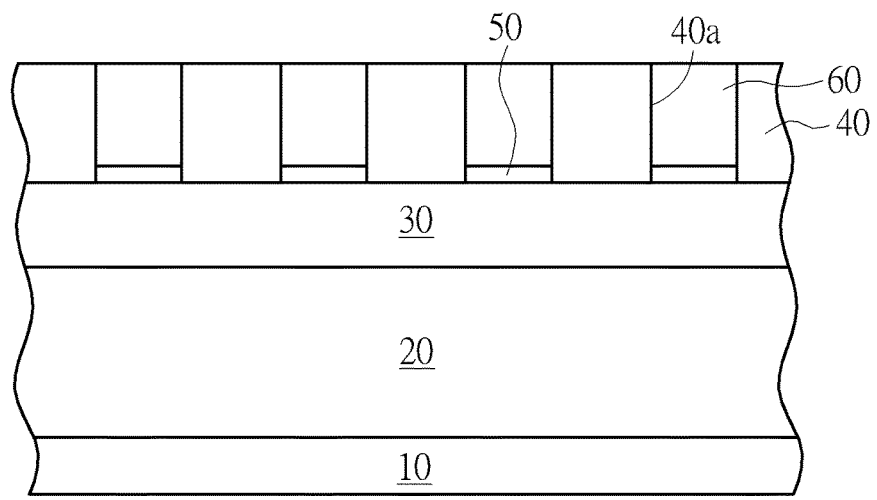

Please refer next to FIG. 3. A brush layer 50 is formed in each opening 40a on the mask layer 30 exposed from the dielectric layer 40, and the opening 40a is filled up with a self-assembled material 60 on the brush layer 50. In the embodiment of present invention, the self-assembled material 60 may include first copolymer and second copolymer mixed and bonded together by covalent bonds. The first copolymer and the second copolymer include different monomers, thus the two copolymers are provided with different properties. For example, the first copolymer is hydrophilic and the second copolymer is hydrophobic. The material combination of the first copolymer and the second copolymer may include polystyrene-polymethylmethacrylate (PS-b-PMMA) copolymer, polystyrene-polymethylacrylate (PS-b-PMA) copolymer, polystyrene-polyethylmethacrylate (PS-b-PEMA) copolymer, polystyrene-polytertbutyl acrylate (PS-b-PtBA) copolymer, polystyrene-polymethylacrylate copolymer, polystyrene-poly-t-butyl methacrylate copolymer, polystyrene-polyethylacrylate copolymer, polystyrene-polyacrylate copolymer, polystyrene-polybutadiene (PS-b-PBD) copolymer, polystyrene-polyisoprene (PS-b-PI) copolymer, polystyrene-polyethyl-enepropylene (PS-b-PEP) copolymer, polystyrene-polydimethylsiloxane (PS-b-PDMS) copolymer, polystyrene-polyethylene (PS-b-PE) copolymer, polystyrene-polyvinylpyridine (PS-b-P4VP) copolymer, polystyrene-polyethylene oxide (PS-b-PEO) copolymer, polyethylene oxide-polyisoprene (PEO-b-PI) copolymer, polyethylene oxide-polybutadiene (PEO-b-PBD) copolymer, polyethylene oxide-polymethylmethacrylate (PEO-b-PMMA) copolymer, polystyrene-polyferrocyanyldimethylsilane (PS-b-PFS) copolymer, polybutadiene-polyvinylpyridine (PBD-b-PVP) copolymer, or polyisoprene-polymethyl-methacrylate (PI-b-PMMA) copolymer, but not limited thereto.

The self-assembled material 60 may be treated by a thermal process to phase-separate the first copolymer and the second copolymer therewithin into individual regions and portions. The region of first copolymer and second copolymer after phase separation may be in different shapes, such as spherical, cylindrical or lamella, depending on their ratio of molar volume. For example, when the ratio of molar volume of the first copolymer to the second copolymer is about 0.2:0.8 to 0.35:0.65, the portion of first copolymer after phase separation would be in cylindrical shape, while the portion of second copolymer would filled up the space outside the portion of first copolymer. When the ratio of molar volume of the first copolymer to the second copolymer is about 0.4:0.6 to 0.6:0.4, the portions of first copolymer and second copolymer after phase separation would be in lamella shape. The period of phase separating regions (ex. the spacing between spheres/cylinders or the total thickness of layers A, B in lamella structure) may vary with the average molecular weight of first copolymer. The larger the average molecular weight, the larger the period of phase separation regions is. In addition, the size of the phase separation regions may also vary with the average molecular weight of first copolymer. The larger the average molecular weight, the larger the size of phase separation area is.

The brush layer 50 between the self-assembled material 60 and the mask layer 30 may be provided with the affinity identical to the first copolymer and the second copolymer. The so call identical affinity is that the brush layer would have same degree of surface energy with respect to the first copolymer and the second copolymer. In the embodiment of present invention, the brush layer 50 may be a neutral self-assembled monolayer, which includes but not limited to phenethyltrichlorosilane (PETCS), phenyltrichlorosilane (PTCS), benzyltrichlorosilane (BZTCS), tolyltrichlorosilane (TTCS), 2-[(trimethoxysilyl)ethyl]-2-pyridine (PYRTMS), 4-biphenylyltrimeth oxysilane (BPTMS), octadecyltrichlorosilane (OTS), 1-naphthyltrimeth oxysilane (NAPTMS), 1-[(trimethoxysilyl)methyl]naphthalene (MNATMS), or (9-methylanthracenyl)trimethoxysilane (MANTMS). The brush layer 50 may also be constituted randomly by the first copolymer and the second copolymer. For example, the brush layer 50 may be made of PS-r-PMMA while the self-assembled material is made of PS-b-PMMA.

Figure 4:
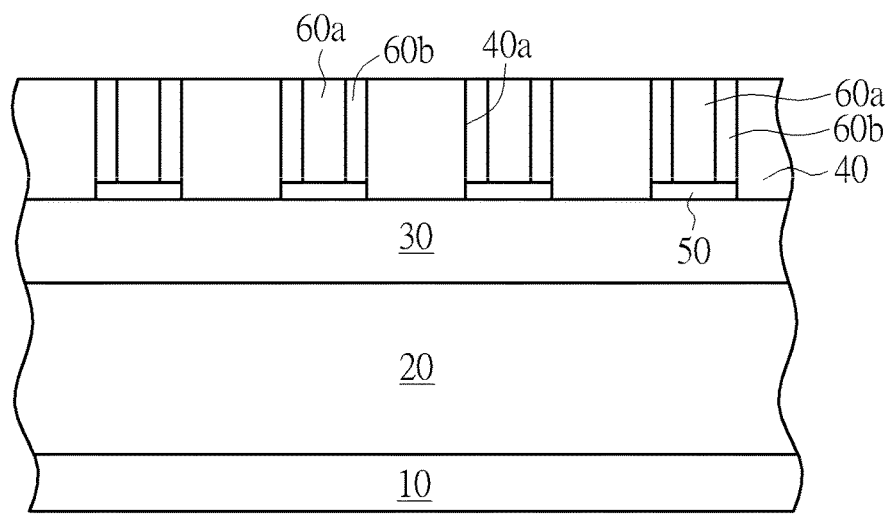

Please refer to FIG. 4. A phase-separating process is performed to divide the self-assembled material 60 into a first portion 60a and a second portion 60b, wherein the first portion 60a is constituted by the first copolymer, such as polymethylmethacrylate (PMMA), and the second portion is constituted by the second copolymer, such as polystyrene (PS). The step of phase separation may include performing a thermal treatment to the self-assembled material 60 at a temperature about 150° C.-350° C. In this way, since the affinity between the second copolymer and the dielectric layer 40 is larger than the affinity between the first copolymer and the dielectric layer 40, the second copolymer would move toward the dielectric layer 40, thereby forming the second portion 60b contacting the sidewall of opening 40a, while the first copolymer move and assemble oppositely toward the center of opening and form the first portion 60a. In the embodiment, the opening 40a is circle, and as the neutral brush layer 50 is disposed at bottom, the self-assembled material 60 formed in the opening 40a would be cylinder, and whose first portion 60a would also be a cylinder in the center after the phase separation. The second portion 60b surrounding the first portion 60a is between the first portion 60a and the dielectric layer 40. This kind of the phase separation may be achieved by keeping the ratio of molar volume of the first copolymer and the second copolymer within the range about 0.2:0.8 to 0.35:0.65. The thickness of first portion 60a and second portion 60b may be controlled by the molecular weights of the first copolymer and the second copolymer. Furthermore, since the brush layer 50 with same surface energy is provided at bottom of the self-assembled material, the first portion 60a and the second portion 60b formed after the phase separation would be perfect, well-distributed cylinders perpendicular to the surface of brush layer 50.

Figure 5:
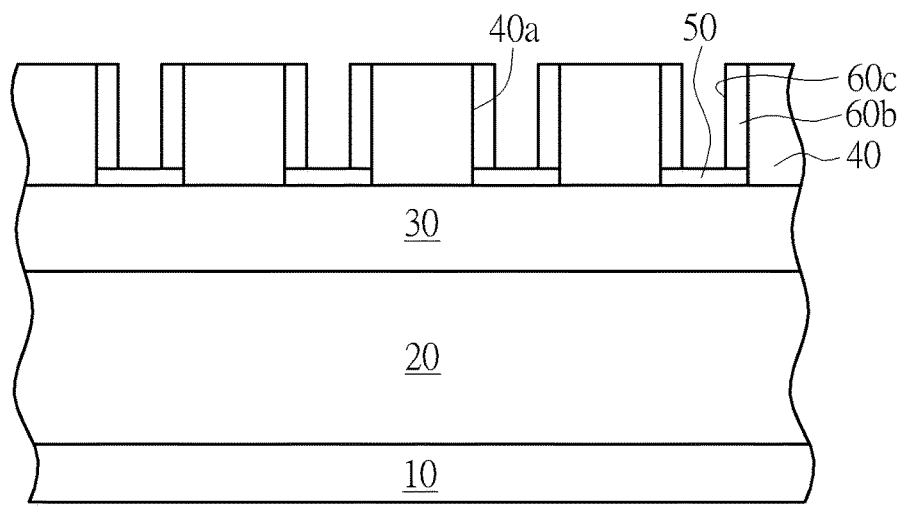

Please refer to FIG. 5. After the phase separation, the phase-separated first portion 60a of the self-assembled material is removed from the opening to form a smaller opening 60c therein and to expose the brush layer 50 from the opening 60c. In this step, the method of removing the first portion 60a is not particularly limited, which may include the process of oxide plasma, ozone treatment, UV treatment, pyrolysis treatment, chemical dissolution treatment, or the combination thereof, as long as the first portion 60a may be selectively removed in the process. Please note that since the second portion 60b is formed inside the opening, the diameter of opening 60c formed at this stage would be smaller than the diameter of original opening 40a. This approach represents the dimension of the feature pattern formed by this nonconventional method is beyond the resolution limit (i.e. the diameter of original opening 40a) of conventional ArF photolithographic equipment.

Figure 6:
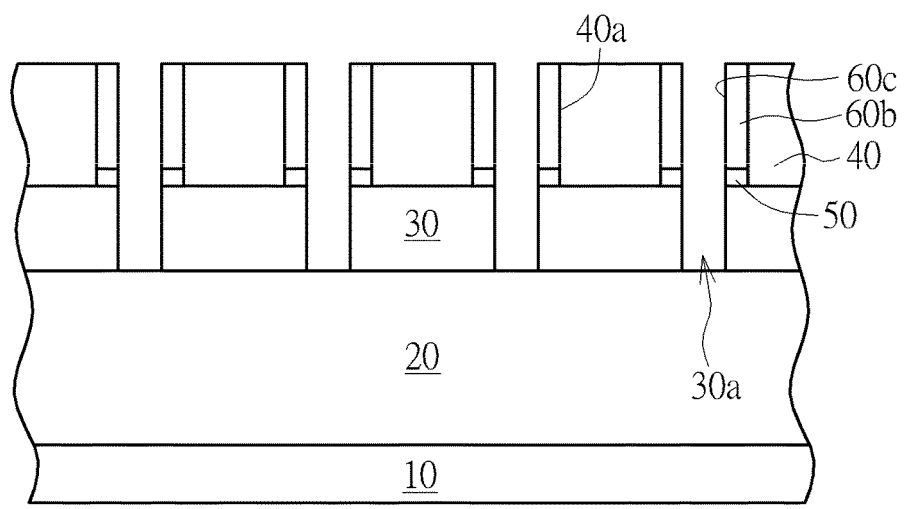

Please refer to FIG. 6. After the first portion 60a of self-assembled material is removed, an etch process is performed using the remaining dielectric layer 40 and the second portion 60b as an etch mask to remove a part of the brush layer 50 and the mask layer 30, thereby forming a first mask pattern 30a in the mask layer 30. Since the underlying target layer 20 has etch selectivity with respect to the mask layer 30, the target layer 20 would not be removed in the etch process. In this way, the mask layer would provide a portion of target pattern required for forming the semiconductor device of present invention.

Figure 7:
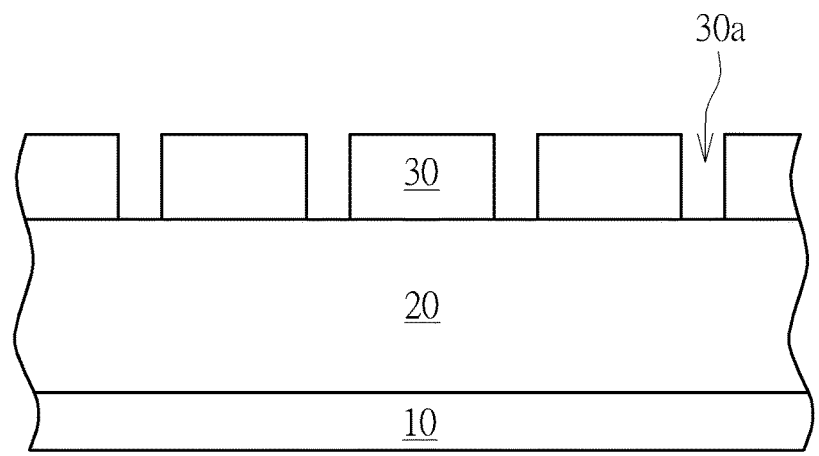

Please refer next to FIG. 7. After the first mask pattern 30a is formed in the mask layer 30, the remaining dielectric layer 40, the brush layer 50, and the second portion 60b of self-assembled material are then removed by, for example, oxide plasma, ozone treatment, UV treatment, pyrolysis treatment, chemical dissolution treatment, or the combination thereof. The first mask pattern 30a in the mask layer 30 at this stage is shown as the circle in FIG. 10, wherein the first mask pattern 30a is regularly aligned with spaces reserved between rows and columns for other openings to be formed in later process. At this point, only half of predetermined target pattern is formed in the present invention. The forming steps of the other half of predetermined target pattern is now described in following embodiment.

Figure 8:
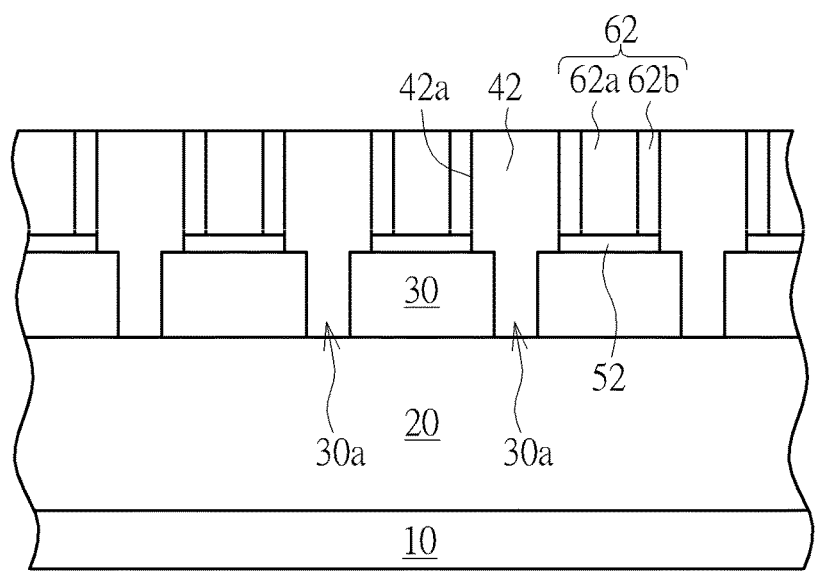

Please refer to FIG. 8. After the remaining dielectric layer 40, the brush layer 50 and the self-assembled material on the mask layer 30 are removed, a dielectric 42, a brush layer 52 and a self-assembled material 62 are then formed sequentially on the mask layer 30 again, wherein the self-assembled material 62 is also divide into a first portion 62a and a second portion 62b by another phase-separating process. The manufacturing method and relevant description of above components is identical with the process flow shown in FIGS. 2-4, wherein the position of opening 42a of dielectric layer 42 is defined between the two openings of the first mask pattern 30a, and the positions of first portion 62a and the second portion 62b of self-assembled material formed therein are also defined between the opening 42a.

Figure 9:
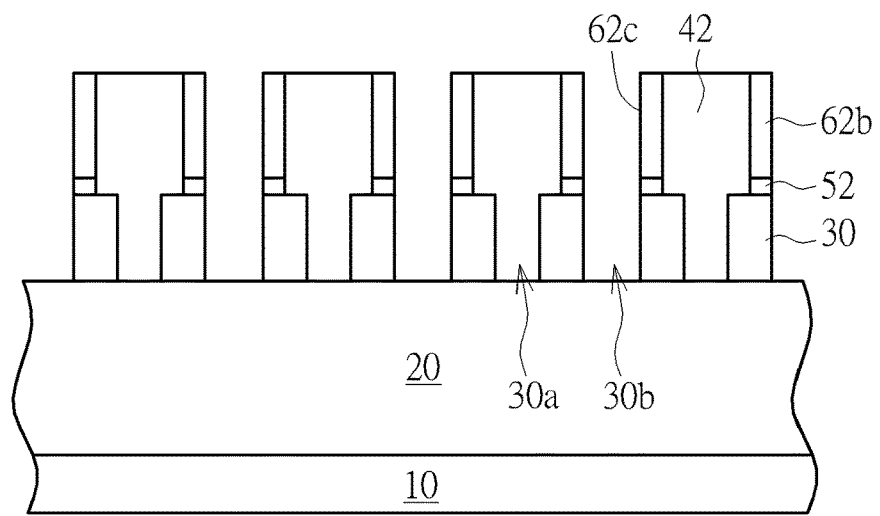

Please refer next to FIG. 9. After the dielectric layer 42, the brush layer 52, and the first portion 62a and the second portion 62b of self-assembled material are formed, the steps of FIGS. 5-6 are repeated to remove the phase-separated first portion 62a of self-assembled material from the openings, thereby forming a smaller opening 62c. An etch process is then performed using the remaining dielectric layer 42 and the second portion 62b of self-assembled material as an etch mask to form mask pattern for openings (i.e. second mask pattern 30b) in underlying mask layer 30, as shown in FIG. 11. In the view of FIG. 11, the opening position of second mask pattern 30b is defined at the space between two rows of the openings of first mask pattern 30a, and the second mask pattern 30b and the first mask pattern 30a are arranged into a regular, uniform common mask pattern 30c as shown in FIG. 12. Accordingly, through the above-described two pattern transferring processes based on the self-assembled materials and appropriate mask pattern arrangement, compact and uniform opening patterns with diameter smaller than the current photolithographic resolution limit may be smoothly formed as shown in FIG. 12 and fulfill the purpose of the present invention. Please note that the common mask pattern 30c is not limited to be the form as shown in FIG. 12. Its opening pattern may also be square, rectangular or strip, and its pattern arrangement is also not limited to the form of staggered array as shown in the figure. Standard array with lower compactness may also be applied in the present invention.

After the forming process of semiconductor patterns based on the self-assembled material in the present invention is properly explained, the following embodiment will focus on the details how to manufacture a semiconductor device by using the above-described method based on the concept of the present invention. The semiconductor device mentioned in the disclosure includes the highly integrated semiconductor memory device, such as dynamic random access memory (DRAM), static random access memory (SRAM), phase change random access memory (PRAM), resistive random access memory (RRAM), magnetoresistive random access memory (MRAM), ferroelectric random access memory (FRAM), flash, micro electromechanical system (MEMS), optoelectronic device, CPU, or digital signal processing (DSP) device. A semiconductor device may include only the same type of semiconductor devices or may be a single chip data processing device including different types of semiconductor devices necessary for providing a complete function.

Figure 13:
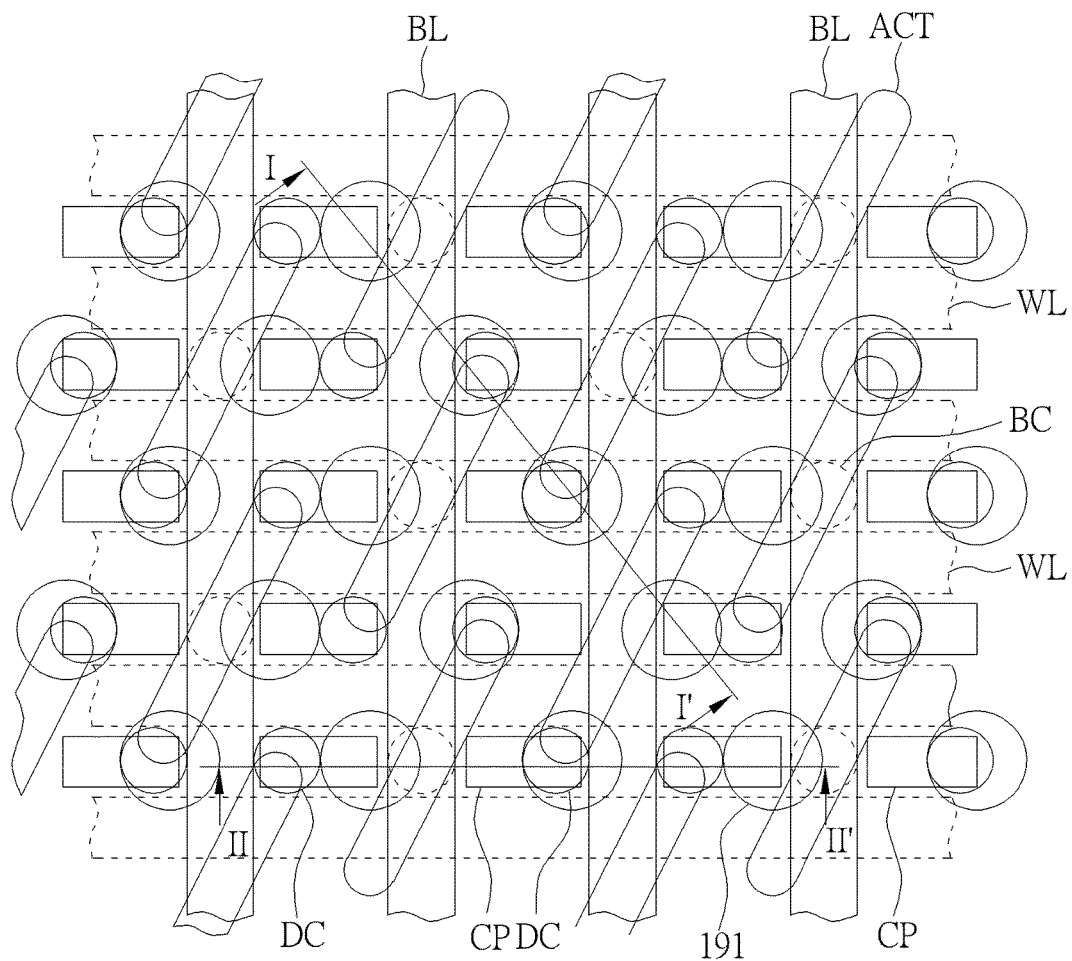
FIG. 13 is a schematic top view of a semiconductor memory device manufactured from the patterns formed by implementing the concept of the present invention.
Figure 14:
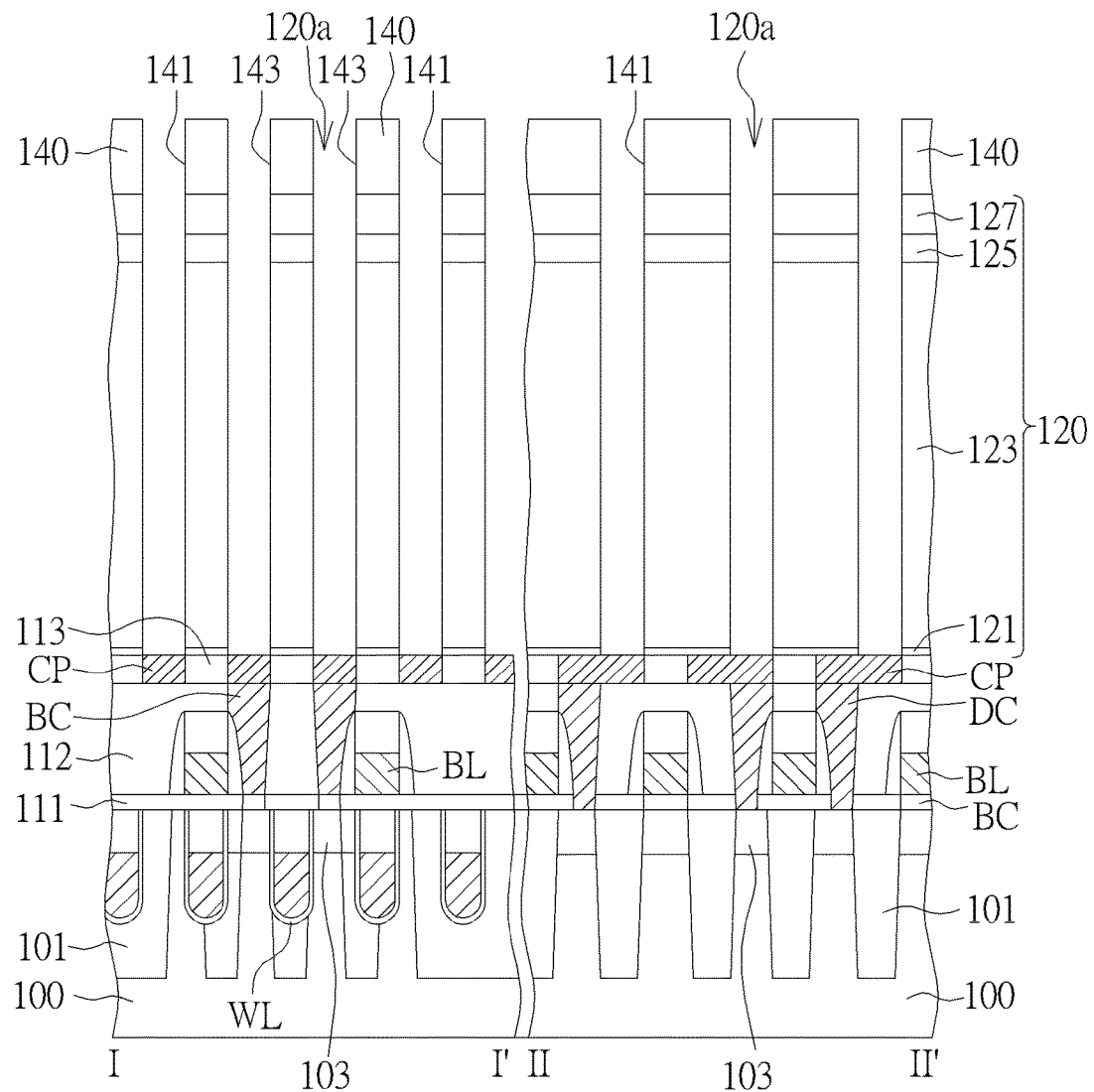
FIG. 14 is a schematic cross-sectional view of the semiconductor device taken along a section lines I-I' and a section lines II-II' in FIG. 13, respectively.

FIG. 13 is a schematic top view of a semiconductor memory device manufactured from the patterns formed by implementing the concept of the present invention. FIG. 14 is a schematic cross-sectional view of the semiconductor device taken along a section lines I-I' and a section lines II-II' in FIG. 13, respectively.

Please refer now to FIG. 13 and FIG. 14. The semiconductor device includes word lines WL and bit lines BL orthogonal to word lines. The positions where the word lines and bit lines intersect are disposed with memory cell. A device insulating layer 101 is formed on the semiconductor substrate 100 to define active regions ACT. The active region ACT is a rod-shaped region with a longitudinal direction diagonal to word line WL and bit line BL. The word lines WL may be disposed to intersect the active regions ACT. In an embodiment, the word lines WL may be formed in a recess region recessed from a surface of the semiconductor substrate 100 by predetermined depth with a gate insulating layer interposed therebetween. Source and drain regions 103 may be formed in the active regions ACT adjacent to opposite sides of the word lines WL. The source and drain regions 103 may be impurity regions doped with impurities. As the word lines WL and the source and drain regions 103 are formed, a plurality of MOS transistors may be formed on the semiconductor substrate 100.

The bit lines BL may be disposed on the semiconductor substrate 100 across the word lines WL. A first interlayer dielectric 111 may be disposed between the bit lines BL and the semiconductor substrate 100, and bit line contact plugs BC may be formed at the first interlayer dielectric 111 to electrically connect the source and drain regions 103 to the bit line BL. A second interlayer dielectric 112 is formed to cover the bit lines BL. Contact plugs DC may be formed in the second interlayer dielectric 112 to electrically connect a data storage component to the source and drain regions 103. In one embodiment, the contact plugs DC may be disposed on the active region ACT adjacent to opposite sides of the bit line BL. Contact pads CP may be formed on the contact plugs DC, respectively. The contact pads CP may be disposed on the second interlayer dielectric 112 to increase the contact area between a bottom electrode of an overlying capacitor and the contact plugs DC.

A mold layer 120 may be formed on a third interlayer dielectric 113 where the contact pads CP are formed. Thickness of the mold layer 120 may vary depending on height of a bottom electrode of a cylindrical capacitor. In one embodiment, the mold layer 120 may include an etch-stop layer 121, a lower mold layer 123, a support layer 125, and an upper mold layer 127 that are stacked in the order, wherein the lower and upper mold layers 123 and 127 may be formed of silicon oxide, and the etch-stop layer 121 and the support layer 125 may be formed of a material having an etch selectivity with respect to the lower and upper mold layers 123 and 127 during a process of dry-etching the mold layers 120. For example, the etch-stop layer 121 and the support layer 126 may be formed of silicon nitride.

Please note that the first opening 141 and the second opening 143 in FIG. 14 are formed by performing an etch process to the mold layer 120 with the mask layer 140 functions as an etch mask. The mask layer 14 is further formed by the above-described concept of present invention. For example, the first openings 141 may be defined by using the first mask pattern 30a and the second openings 143 may be defined by using the second mask pattern 30b. The combined common mask pattern 30c may be then used as an etch mask to form the first openings 141 and second openings 143 concurrently. The first openings 141 and second openings 143 may be further used to form holes 120a in the mold layer 120 and expose the contact pads CP.

In summary, the advantage and creativity of present invention may be achieved by using the mask patterns formed by the concept of present invention to manufacture semiconductor devices (ex. semiconductor memory devices shown in FIGS. 13 and 14) with larger compactness in layout unit area and uniform diameter smaller than current photolithographic resolution limit, without using expensive advanced photolithographic equipment or additional complicated processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming semiconductor patterns, comprising:
   providing a substrate with a target layer, a mask layer, and a first dielectric layer thereon, wherein said first dielectric layer is provided with multiple first openings;
   filling up a first self-assembled material in said first openings;
   phase-separating said first self-assembled material to form a first portion and a second portion surrounding said first portion;
   removing said first portion to form multiple second openings;
   performing a first etch process using said first dielectric layer and said second portion as etch masks to form a first mask pattern in said mask layer;
   removing remaining said first dielectric layer on said mask layer and said second portion;
   forming a second dielectric layer on said mask layer, wherein said second dielectric layer is provided with multiple third openings;
   filling up a second self-assembled material in said third openings;
   phase-separating said second self-assembled material to form a third portion and a fourth portion surrounding said third portion;
   removing said third portion to form multiple fourth openings; and
   performing a second etch process using said second dielectric layer and said fourth portion as etch masks to form a second mask pattern in said mask layer, wherein said second mask pattern and said first mask pattern collectively constitutes a common mask pattern.

2. The method of forming semiconductor patterns of claim 1, further comprising performing a third etch process using said mask layer with said common mask as an etch mask to form patterns in said target layer.

3. The method of forming semiconductor patterns of claim 1, further comprising a step of forming a first brush layer in said first openings before said first openings are filled up with said first self-assembled material and a step of forming a second brush layer in said third openings before said third openings are filled up with said second self-assembled material.

4. The method of forming semiconductor patterns of claim 3, wherein the material of said first brush layer and said second brush layer comprises phenethyltrichlorosilane (PETCS), phenyltrichlorosilane (PTCS), benzyltrichlorosilane (BZTCS), tolyltrichlorosilane (TTCS), 2-[(trimethoxysilyl)ethyl]-2-pyridine (PYRTMS), 4-biphenylyltrimethoxysilane (BPTMS), octadecyltrichlorosilane (OTS), 1-naphthyltrimeth oxysilane (NAPTMS), 1-[(trimethoxysilyl)methyl]naphthalene (MNATMS), or (9-methylanthracenyl)trimethoxysilane (MANTMS).

5. The method of forming semiconductor patterns of claim 1, wherein said first self-assembled material and said second self-assembled material comprises mixed first copolymer and second copolymer.

6. The method of forming semiconductor patterns of claim 5, wherein the combination of the material of said first copolymer and said second copolymer comprises a polystyrene-polymethylmethacrylate (PS-b-PMMA) copolymer, polystyrene-polymethylacrylate (PS-b-PMA) copolymer, polystyrene-polyethylmethacrylate (PS-b-PEMA) copolymer, polystyrene-polytertbutyl acrylate (PS-b-PtBA) copolymer, polystyrene-polymethylacrylate copolymer, polystyrene-poly-t-butyl methacrylate copolymer, polystyrene-polyethylacrylate copolymer, polystyrene-polyacrylate copolymer, polystyrene-polybutadiene (PS-b-PBD) copolymer, polystyrene-polyisoprene (PS-b-PI) copolymer, polystyrene-polyethylenepropylene (PS-b-PEP) copolymer, polystyrene-polydimethylsiloxane (PS-b-PDMS) copolymer, polystyrene-polyethylene (PS-b-PE) copolymer, polystyrene-polyvinylpyridine (PS-b-P4VP) copolymer, polystyrene-polyethylene oxide (PS-b-PEO) copolymer, polyethylene oxide-polyisoprene (PEO-b-PI) copolymer, polyethylene oxide-polybutadiene (PEO-b-PBD) copolymer, polyethylene oxide-polymethylmethacrylate (PEO-b-PMMA) copolymer, polystyrene-polyferrocyanyldimethylsilane (PS-b-PFS) copolymer, polybutadiene-polyvinylpyridine (PBD-b-PVP) copolymer, or polyisoprene-polymethyl-methacrylate (PI-b-PMMA) copolymer.

7. The method of forming semiconductor patterns of claim 1, wherein said third openings in said second dielectric layer overlaps the central position of said first mask pattern in said mask layer.

8. The method of forming semiconductor patterns of claim 1, wherein the diameters of said first opening and said third opening are the resolution limits of photolithographic equipment.

9. The method of forming semiconductor patterns of claim 1, wherein said phase-separating step comprises a thermal treatment in temperature range of 150-350° C.

10. The method of forming semiconductor patterns of claim 1, wherein the method of removing said first portion and said third portion comprises oxide plasma, ozone treatment, UV treatment, pyrolysis treatment, chemical dissolution treatment, or the combination thereof.

11. The method of forming semiconductor patterns of claim 1, wherein said first mask pattern and said second mask pattern is aligned into said common mask pattern in standard array or staggered array.

* * * * *